(12) United States Patent
Liu et al.

(10) Patent No.: US 10,910,562 B2
(45) Date of Patent: Feb. 2, 2021

(54) ORGANIC ELECTROLUMINESCENT DEVICE AND PREPARATION METHOD, EVAPORATION DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xin Liu, Beijing (CN); Chao Kong, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/323,765

(22) PCT Filed: May 30, 2018

(86) PCT No.: PCT/CN2018/089035
§ 371 (c)(1),
(2) Date: Feb. 6, 2019

(87) PCT Pub. No.: WO2018/228198
PCT Pub. Date: Dec. 20, 2018

(65) Prior Publication Data
US 2019/0173009 A1 Jun. 6, 2019

(30) Foreign Application Priority Data
Jun. 14, 2017 (CN) .......................... 2017 1 0446359

(51) Int. Cl.
*H01L 23/48* (2006.01)
*H01L 23/52* (2006.01)
(Continued)

(52) U.S. Cl.
CPC ............ *H01L 51/001* (2013.01); *C23C 14/12* (2013.01); *C23C 14/24* (2013.01);
(Continued)

(58) Field of Classification Search
CPC ... H01L 51/001; H01L 51/5012; H01L 51/56; H01L 2251/556; H01L 2251/56
See application file for complete search history.

(56) References Cited

U.S. PATENT DOCUMENTS

2002/0155632 A1* 10/2002 Yamazaki ............. C23C 14/568
438/29
2004/0132228 A1* 7/2004 Magno .................... C23C 14/28
438/99
(Continued)

FOREIGN PATENT DOCUMENTS

| CN | 1428817 A | 7/2003 |
|---|---|---|
| CN | 1723741 A | 1/2006 |
| CN | 107123754 A | 9/2017 |

OTHER PUBLICATIONS

V.I. Adamovich, et al; "High temperature operation and stability of phosphorescent OLEDs", Current Applied Physics, Jan. 2005, 5(1):15-18; Available online Apr. 17, 2004.
(Continued)

*Primary Examiner* — Bradley Smith
*Assistant Examiner* — David J Goodwin

(57) ABSTRACT

An organic electroluminescent device, a manufacturing method thereof and an evaporation apparatus are provided. The manufacturing method for the organic electroluminescent device includes: forming, on a base substrate, a first electrode layer; performing vacuum evaporation on an organic functional layer material to be evaporated, and performing a heat treatment, during the evaporation of the organic functional layer material to be evaporated, on the base substrate on which the first electrode layer is formed,
(Continued)

so as to form an organic functional layer on the base substrate on which the first electrode layer is formed; and forming, on the base substrate on which the organic functional layer is formed, a second electrode layer.

15 Claims, 1 Drawing Sheet

(51) Int. Cl.
*H01L 51/00* (2006.01)
*H01L 51/56* (2006.01)
*C23C 14/12* (2006.01)
*C23C 14/24* (2006.01)
*C23C 14/58* (2006.01)
*H01L 27/32* (2006.01)
*H01L 51/50* (2006.01)

(52) U.S. Cl.
CPC ...... *C23C 14/5806* (2013.01); *H01L 51/0026* (2013.01); *H01L 51/56* (2013.01); *H01L 27/3211* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 2251/556* (2013.01)

(56) References Cited

U.S. PATENT DOCUMENTS

| | | | |
|---|---|---|---|
| 2005/0016462 A1* | 1/2005 | Yamazaki | H05B 33/10 118/726 |
| 2005/0106322 A1 | 5/2005 | Yamazaki et al. | |
| 2008/0131587 A1 | 6/2008 | Boroson et al. | |
| 2009/0121624 A1* | 5/2009 | D'Andrade | H01L 51/0025 313/504 |
| 2014/0166989 A1* | 6/2014 | Ma | H01L 51/0097 257/40 |
| 2014/0264317 A1* | 9/2014 | Uezawa | H01L 51/5275 257/40 |

OTHER PUBLICATIONS

M.Y. Chan, et al; "Efficiency enhancement and retarded dark-spots growth of organic light-emitting devices by high-temperature processing", Chemical Physics Letters; vol. 371, Issues 5-6, Apr. 14, 2003, pp. 700-706.

A.B. Djurisic, et al; "Influence of atmospheric exposure of tris (8-hydroxyquinoline) aluminum ($Alq^3$): a photoluminescence and absorption study", Applied Physics A, vol. 78, Issue 3, pp. 375-380; Feb. 2004.

Paulo N.M. dos Anjos, et al; "Temperature dependence of electroluminescence degradation in organic light emitting devices without and with a copper phthalocyanine buffer layer", Organic Electronics, vol. 3, Issue 1, Mar. 2002, pp. 9-13.

Z.Q. Gao, et al; "Organic electroluminescent devices by high-temperature processing and crystalline hole transporting layer" Appl. Phys. Lett. 74, 3269; Published online May 24, 1999.

D.S. Qin, et al; "Effects of the morphologies and structures of light-emitting layers on the performance of organic electroluminescent devices", Applied Physics Letters vol. 78, Issue 4, Published online Jan. 16, 2001, p. 437.

The First Chinese Office Action dated May 28, 2018; Appln. No. 201710446359.5.

International Search Report and Written Opinion dated Sep. 7, 2018: PCT/CN2018/089035.

* cited by examiner

ORGANIC ELECTROLUMINESCENT DEVICE AND PREPARATION METHOD, EVAPORATION DEVICE

CROSS-REFERENCE TO RELATED APPLICATIONS

This application claims the benefit of Chinese patent application No. 201710446359.5 filed on Jun. 14, 2017, which is hereby entirely incorporated by reference as a part of the present application.

TECHNICAL FIELD

Embodiments of the present disclosure relate to an organic electroluminescent device, a manufacturing method of the organic electroluminescent device and an evaporation apparatus.

BACKGROUND

Organic light-emitting diode (OLED) devices (i.e., organic electroluminescent devices) have the advantages of being self-luminous, high luminous efficiency, low power consumption, fast response, wide viewing angle, high brightness, being colorful, being thin and light, etc., thus are considered to have broad application prospects in illumination and display device markets and have been highly valued in the international optoelectronic academia and industry.

At present, an organic functional layer of the OLED device is manufactured by a vacuum evaporation method, a process of evaporating and depositing so as to form the organic functional layer has high requirements on degrees of vacuum and cleanliness in an evaporation chamber, and different process conditions in the process cause great differences in performances of the OLED device; moreover, at present, a service life of the OLED device manufactured by the vacuum evaporation method is lower, which is inconsistent with market demands.

Thus, how to improve the service life of the organic electroluminescent device is a research hotspot by those skilled in the art.

SUMMARY

Embodiments of the present disclosure provide an organic electroluminescent device, a manufacturing method of the organic electroluminescent device and an evaporation apparatus for improving the service life of the organic electroluminescent device.

The embodiments of the present disclosure provide a manufacturing method of the organic electroluminescent device, which includes: forming a first electrode layer on a base substrate; forming an organic functional layer on the base substrate on which the first electrode layer is formed, by performing vacuum evaporation on an organic functional layer material to be evaporated, and by performing a heat treatment on the base substrate on which the first electrode layer is formed in a process of performing the evaporation on the organic functional layer material to be evaporated; and forming a second electrode layer on the base substrate on which the organic functional layer is formed.

For example, the manufacturing method further includes: determining a heat treatment temperature according to a property of the organic functional layer material to be evaporated, and heating the base substrate to the heat treatment temperature by using a heat source that is in an evaporation chamber. In the method, by using the heat treatment temperature, performing the heat treatment on the base substrate on which the first electrode layer is formed in the process of performing the evaporation on the organic functional layer material to be evaporated; and/or in a process of heating the base substrate to the heat treatment temperature, performing the heat treatment on the base substrate on which the first electrode layer is formed in the process of performing the evaporation on the organic functional layer material to be evaporated.

For example, the heat treatment temperature is determined according to thermal stability of the organic functional layer material to be evaporated.

For example, the heating the base substrate by using the heat source that is in the evaporation chamber includes: heating the base substrate by using the heat source that is in the evaporation chamber and on a side of the base substrate, wherein the side of the base substrate faces away from an evaporation source.

For example, the heat source is a heating substrate.

For example, the heat treatment temperature is from 40° C. to 150° C.

For example, in the process of performing the evaporation on the organic functional layer material to be evaporated, a vacuum degree in the evaporation chamber is lower than $10^{-4}$ Pa.

For example, the forming the organic functional layer on the base substrate on which the first electrode layer is formed includes: sequentially laminating a hole injection layer, a hole transport layer, a light-emitting layer, an electron transport layer and an electron injection layer, which are formed by vacuum evaporation, on the base substrate on which the first electrode layer is formed.

For example, after forming the hole transport layer and before forming the light-emitting layer, the manufacturing method further includes: forming an electron blocking layer by vacuum evaporation on the hole transport layer.

For example, after forming the light-emitting layer and before forming the electron transport layer, the manufacturing method further includes: forming a hole blocking layer by vacuum evaporation on the light-emitting layer.

The embodiments of the present disclosure further provide an organic electroluminescence device, and the organic electroluminescence device is an organic electroluminescence device manufactured by using the manufacturing method provided by any one of the embodiments of the present disclosure.

The embodiments of the present disclosure further provide an evaporation apparatus, which includes: an evaporation chamber, an evaporation source in the evaporation chamber, a heat source in the evaporation chamber, wherein the heat source is configured for performing a heat treatment on a base substrate, on which a first electrode layer is formed, in a process of performing evaporation on an organic functional layer material to be evaporated in the manufacturing method provided by any one of the embodiments of the present disclosure.

For example, the heat source is a heating substrate in the evaporation chamber and on a side of the base substrate, and the side of the base substrate faces away from the evaporation source.

BRIEF DESCRIPTION OF THE DRAWINGS

In order to clearly illustrate the technical solution of the embodiments of the disclosure, the drawings of the embodiments will be briefly described in the following; it is obvious

DETAILED DESCRIPTION

Figure 1:
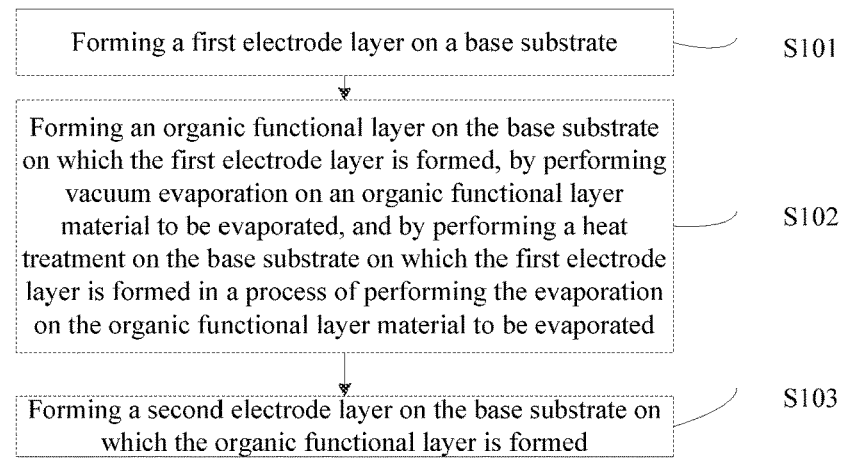
FIG. 1 is a schematic flow chart of a manufacturing method of an organic electroluminescent device according to the embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Embodiments of the present disclosure provide an organic electroluminescent device, a manufacturing method of the organic electroluminescent device and an evaporation apparatus for improving the service life of the organic electroluminescent device (OLED device).

It should be noted that thicknesses and shapes of layers in the drawings of the present disclosure do not reflect true proportions, and are merely intended to illustrate the present disclosure.

Figure 2:
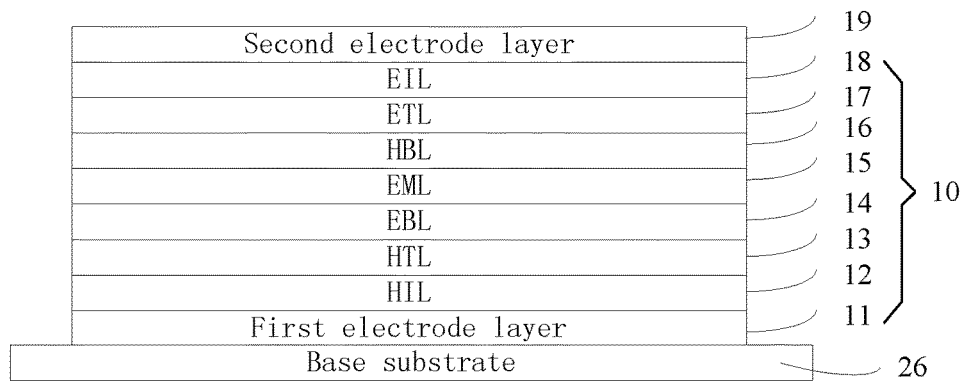
FIG. 2 is a schematic structural view of the organic electroluminescent device according to the embodiments of the present disclosure.
Figure 3:
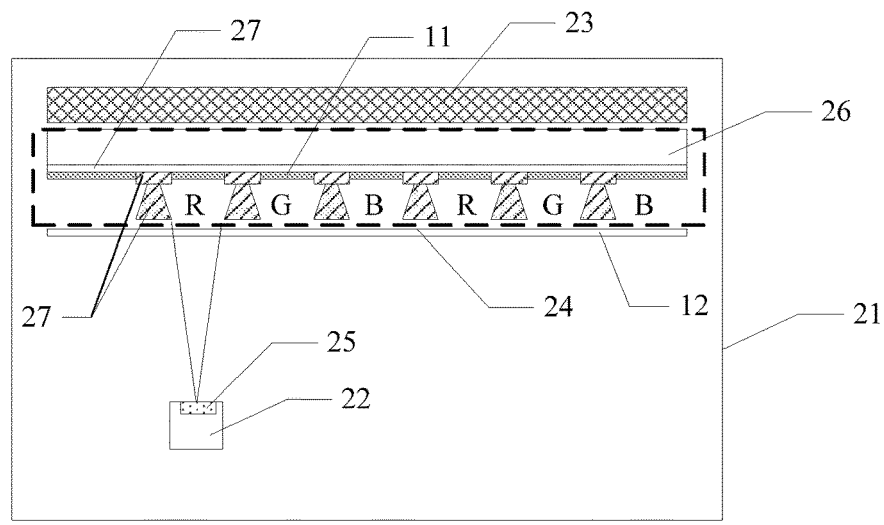
FIG. 3 is a schematic structural view of an evaporation apparatus according to the embodiments of the present disclosure.

Referring to FIG. 1 to FIG. 3, the manufacturing method of the organic electroluminescent device according to the embodiments of the present disclosure includes following steps S101 to S103.

S101, forming a first electrode layer 11 on a base substrate 26.

For example, a material of the first electrode layer 11 is ITO (indium tin oxide), IZO (iridium zinc oxide), AZO (aluminum-doped zinc oxide), or FTO (fluorine-doped tin oxide) or the like.

S102, forming an organic functional layer 10 on the base substrate 26 on which the first electrode layer 11 is formed, by performing vacuum evaporation on an organic functional layer material 25 to be evaporated, and by performing a heat treatment on the base substrate 26 on which the first electrode layer 11 is formed in a process of performing the evaporation on the organic functional layer material 25 to be evaporated.

For example, the organic functional layer material 25 is an organic small molecule material.

In an embodiment, the forming the organic functional layer 10 on the base substrate 26 on which the first electrode layer 11 is formed in step S102, for example, includes: as shown in FIG. 2, sequentially laminating a hole injection layer (HIL) 12, a hole transport layer (HTL) 13, a light-emitting layer (EML) 15, an electron transport layer (ETL) 17 and an electron injection layer (EIL) 18 which are manufactured by vacuum evaporation on the base substrate 26 on which the first electrode layer 11 is formed.

In an embodiment, after the hole transport layer 13 is manufactured and before the light-emitting layer 15 is manufactured, for example, the method further includes: forming an electron blocking layer (EBL) 14 by vacuum evaporation on the hole transport layer 13.

In an embodiment, after the light-emitting layer 15 is manufactured and before the electron transport layer 17 is manufactured, for example, the method further includes: forming a hole blocking layer (HBL) 16 by vacuum evaporation on the light-emitting layer 15.

For example, the organic functional layer material 25 to be evaporated in the above step S102 is a material for forming any one of the hole injection layer 12, the hole transport layer 13, the electron blocking layer 14, the light-emitting layer 15, the hole blocking layer 16, the electron transport layer 17 and the electron injection layer 18. In some embodiments, for example, a part of the hole injection layer 12, the hole transport layer 13, the electron blocking layer 14, the light-emitting layer 15, the hole blocking layer 16, the electron transport layer 17 and the electron injection layer 18 is manufactured through the step S102, or each of these layers is manufactured by using the step S102.

The heat treatment refers to heating the base substrate 26, so that the organic functional layer material that is evaporated and deposited on the base substrate 26 is slowly cooled to a certain temperature (for example, being cooled to a heat treatment temperature as described below) by the heat treatment to obtain the organic functional layer 10. Thereby, the morphology of the organic functional layer 10 is improved.

S103, forming a second electrode layer 19 on the base substrate 26 on which the organic functional layer 10 is formed.

For example, the second electrode layer 19 is formed of a non-transparent metal material such as aluminum, nickel or gold; or the second electrode layer 19 is formed of a transparent material having a conductive dielectric layer/metal layer/conductive dielectric layer structure, such as ITO/Ag/ITO, ZnS/Ag/ZnS, etc., which are not limited by the embodiments of the present disclosure.

For example, the first electrode layer 11 is an anode layer and the second electrode layer 12 is a cathode layer; or, the first electrode layer 11 is the cathode layer and the second electrode layer 12 is the anode layer.

In the method provided by the embodiments of the present disclosure, in the process of performing the evaporation on the organic functional layer material 25 to be evaporated, the base substrate 26 on which the first electrode layer 11 is treated by using the heat treatment to improve the morphology of the organic functional layer 10, thereby the performance of the organic functional layer 10 is affected, and the service life of the organic electroluminescent device is increased.

For example, the manufacturing method provided by at least one embodiment of the present disclosure further includes: determining the heat treatment temperature according to a property of the organic functional layer material to be evaporated; and heating the base substrate 26 by using a heat source 23 disposed in an evaporation chamber 21 so that the base substrate 26 is heated to the heat treatment temperature (i.e., a temperature rising process of the base substrate 26). In this case, by using the heat treatment temperature, the heat treatment is performed on the base substrate 26 on which the first electrode layer 11 is formed in the process of performing the evaporation on the organic functional layer material 25 to be evaporated; and/or in the process of heating the base substrate 26 to the heat treatment temperature, the heat treatment is performed on the base substrate 26 on which the first electrode layer 11 is formed in the process of performing the evaporation on the organic functional layer material to be evaporated.

In the embodiments of the present disclosure, the heat treatment being performed in the process of heating the base substrate 26 to the heat treatment temperature means that the evaporation is performed on the organic functional layer material 25 to be evaporated on the base substrate 26 in the temperature rising process of the base substrate 26. On this basis, for example, after the base substrate 26 is heated to the heat treatment temperature, the heat treatment is further performed on the base substrate 26 by using the heat treatment temperature in the process of performing the evaporation on the organic functional layer material 25 to be evaporated on the base substrate 26.

In the manufacturing method provided by the embodiments of the present disclosure, for example, heating the base substrate 26 before performing the evaporation on the organic functional layer material to be evaporated effectively reduces water, oxygen and other impurities adsorbed on a surface of the base substrate 26, and thus improves the service life of the organic electroluminescent device.

In the embodiments of the present disclosure, for example, the heat treatment temperature is determined according to a property of the organic functional layer material to be evaporated, and the heat treatment temperature is used to perform the heat treatment on the base substrate on which the first electrode layer is formed in the process of performing the evaporation on the organic functional layer material to be evaporated, so that the morphology of the organic functional layer is better improved, and thus the service life of the organic electroluminescent device is improved.

Regarding determining the heat treatment temperature according to the property of the organic functional layer material 25 to be evaporated in the above step S1021, for example, the heat treatment temperature is determined according to thermal stability of the organic functional layer material 25 to be evaporated, and at this heat treatment temperature, a better morphology of the organic functional layer 10 is obtained.

For example, the above heat treatment temperature is from 40° C. to 150° C.

For example, the heat treatment temperature is measured in advance, and for example, a correspondence table between the property of the organic functional layer material to be evaporated and the heat treatment temperature is established.

For example, in the process of performing the evaporation on the organic functional layer material to be evaporated, a vacuum degree in the evaporation chamber 21 is lower than $10^{-4}$ Pa.

In an embodiment, in order to heat the base substrate 26 more uniformly to better improve the morphology of the organic functional layer 10, for example, the step S1022 of heating the base substrate by using the heat source 23 in the evaporation chamber 21 includes: heating the base substrate 26 by using a heating substrate (an example of the heat source 23) disposed in the evaporation chamber 21 and located on a side of the base substrate 23, the side of the base substrate 23 facing away from the evaporation source 22.

For example, the heating substrate is a flat metal plate (for example, a steel plate). As shown in FIG. 3, in the case where the heat source 23 is a heating substrate, the heating substrate is parallel to the base substrate 26, and an entire surface that is included by the heating substrate and faces the base substrate 26 is a flat surface.

In an embodiment, the forming the light-emitting layer 15 by vacuum evaporation includes, for example, the following steps S151 to S153.

Step S151: forming a red-light light-emitting layer in a red-light region R (shown in FIG. 3) of the base substrate 26 by performing vacuum evaporation on a red-light light-emitting layer material to be evaporated, and by performing a heat treatment on the base substrate 26 in a process of performing the evaporation on the red-light light-emitting layer material to be evaporated.

Step S152: forming a green-light light-emitting layer in a green-light region G (shown in FIG. 3) of the base substrate by performing vacuum evaporation on a green-light light-emitting layer material to be evaporated, and by performing a heat treatment on the base substrate 26 in a process of performing the evaporation on the green-light light-emitting layer material to be evaporated.

Step S153: forming a blue-light light-emitting layer, as shown in FIG. 3, in a blue-light region B (shown in FIG. 3) of the base substrate 26 by performing vacuum evaporation on a blue-light light-emitting layer material to be evaporated, and by performing a heat treatment on the base substrate 26 in a process of performing the evaporation on the blue-light light-emitting layer material to be evaporated.

It should be noted that the evaporation of the red-light light-emitting layer, the evaporation of the green-light light-emitting layer and the evaporation of the blue-light light-emitting layer may be performed in any order.

Hereinafter, taking an example that the organic electroluminescent device includes the first electrode layer 11, the hole injection layer 12, the hole transport layer 13, the electron blocking layer 14, the light-emitting layer 15, the hole blocking layer 16, the electron transport layer 17, the electron injection layer 18 and the second electrode layer 19 which are sequentially stacked (shown in FIG. 2), the manufacturing process of the organic electroluminescent device provided by the embodiments of the present disclosure is described specifically.

Step 1: the forming the first electrode layer 11, which, for example, includes: forming the first electrode layer (for example, the anode layer) 11 on the base substrate 26 (for example, a glass substrate, a quartz substrate, or a plastic substrate).

Step 2: the forming the hole injection layer 12, which includes, for example, the following steps S21 to S23.

Step S21: determining a first heat treatment temperature according to a property (for example, thermal stability) of a hole injection layer material to be evaporated. For example, the first heat treatment temperature is from 40° C. to 150° C.

Step S22: by using the flat heat source 23 (for example, the steel plate) that is in the evaporation chamber 21 and at the side of the base substrate 26 facing away from the evaporation source 26, heating the base substrate 26 on which the first electrode layer is formed to the first heat treatment temperature. In this step S22, heating the base substrate 26 on which the first electrode layer is formed effectively reduces water, oxygen and other impurities adsorbed on a surface of the first electrode layer, plays a role of cleaning to a certain extent, and thereby improves the service life of the organic electroluminescent devices.

Step S23: forming the hole injection layer 12 having a first thickness (for example, the first thickness is from 5 nm to 15 nm) on the base substrate 26 on which the first electrode layer is formed, by performing vacuum evaporation on the hole injection layer material to be evaporated, and by performing a first heat treatment on the base substrate provided with the first electrode layer by using the first heat treatment temperature obtained in the above step S22 in the process of performing the evaporation on the hole injection layer material to be evaporated. For example, in the manufacturing process (i.e., in the step S23), the vacuum degree in the evaporation chamber 21 is lower than $10^{-4}$ Pa.

Step 3: the forming the hole transport layer 13, which includes, for example, the following steps S31 to S33.

Step S31: determining a second heat treatment temperature according to a property (for example, thermal stability) of a hole transport layer material to be evaporated. For example, the second heat treatment temperature is from 40° C. to 150° C.

Step S32: by using the flat heat source 23 (for example, the steel plate) that is in the evaporation chamber 21 and at the side of the base substrate 26 facing away from the evaporation source 26, heating the base substrate 26 on which the hole injection layer 12 (as shown in FIG. 2) is formed to the second heat treatment temperature.

Step S33: forming the hole transport layer 12 having a second thickness (for example, the second thickness is from 40 nm to 100 nm) on the base substrate 26 on which the hole injection layer 12 is formed, by performing vacuum evaporation on the hole transport layer material to be evaporated, and by performing a second heat treatment on the base substrate 26 provided with the hole injection layer 12 by using the second heat treatment temperature in the process of performing the evaporation on the hole transport layer material to be evaporated. For example, in the manufacturing process (i.e., in the step S33), the vacuum degree in the evaporation chamber 21 is lower than $10^{-4}$ Pa.

Step 4: the forming the electron blocking layer 14, which includes, for example, the following steps S41 to S43.

Step S41: determining a third heat treatment temperature according to a property (for example, thermal stability) of an electron blocking layer material to be evaporated. For example, the third heat treatment temperature is from 40° C. to 150° C.

Step S42, by using the flat heat source 23 (for example, the steel plate) that is in the evaporation chamber 21 and at the side of the base substrate 26 facing away from the evaporation source 26, heating the base substrate 26 on which the hole transport layer 13 is formed to the third heat treatment temperature.

Step S43: forming the electron blocking layer 14 having a third thickness (for example, the third thickness is from 5 nm to 20 nm) on the base substrate 26 on which the hole transport layer 13 is formed, by performing vacuum evaporation on the electron blocking layer material to be evaporated, and by performing a third heat treatment on the base substrate 26 provided with the hole transport layer 13 by using the third heat treatment temperature in the process of performing the evaporation on the electron blocking layer material to be evaporated. For example, in the manufacturing process (i.e., in the step S43), the vacuum degree in the evaporation chamber 21 is lower than $10^{-4}$ Pa.

Step 5: the forming the light-emitting layer 15, which includes, for example, the following steps S51 to S53.

Step S51: the forming the red-light light-emitting layer, which includes, for example, the following steps S511 to S513.

Step S511, determining a fourth heat treatment temperature according to a property (for example, thermal stability) of a red-light light-emitting layer material to be evaporated. For example, the fourth heat treatment temperature is from 40° C. to 150° C.

Step S512: by using the flat heat source 23 (for example, the steel plate) that is in the evaporation chamber 21 and at the side of the base substrate 26 facing away from the evaporation source 26, heating the base substrate 26 on which the electron blocking layer 14 is formed to the fourth heat treatment temperature.

Step S513: forming the red-light light-emitting layer R having a fourth thickness (for example, the fourth thickness is from 30 nm to 80 nm) in the red-light region of the base substrate 26 on which the electron blocking layer 14 is formed, by performing vacuum evaporation on the red-light light-emitting layer material to be evaporated, and by performing a fourth heat treatment on the base substrate 26 provided with the electron blocking layer 14 by using the fourth heat treatment temperature in the process of performing the evaporation on the red-light light-emitting layer material to be evaporated. For example, in the manufacturing process (i.e., in the step S513), the vacuum degree in the evaporation chamber 21 is lower than $10^{-4}$ Pa.

Step S52: the forming the green-light light-emitting layer, which includes, for example, the following steps S521 to S523.

Step S521: determining a fifth heat treatment temperature according to a property (for example, thermal stability) of a green-light light-emitting layer material to be evaporated. For example, the fifth heat treatment temperature is from 40° C. to 150° C.

Step S522: by using the flat heat source 23 (for example, the steel plate) that is in the evaporation chamber 21 and at the side of the base substrate 26 facing away from the evaporation source 26, heating the base substrate 26 on which the electron blocking layer 14 is formed to the fifth heat treatment temperature.

Step S523: forming the green-light light-emitting layer G having a fifth thickness (for example, the fifth thickness is from 20 nm to 80 nm) in the green-light region of the base substrate 26 on which the electron blocking layer 14 is formed, by performing vacuum evaporation on the green-light light-emitting layer material to be evaporated, and by performing a fifth heat treatment on the base substrate 26 provided with the electron blocking layer 14 by using the fifth heat treatment temperature in the process of performing the evaporation on the green-light light-emitting layer material to be evaporated. For example, in the manufacturing process (i.e., in the step S523), the vacuum degree in the evaporation chamber 21 is lower than $10^{-4}$ Pa.

Step S53: the forming the blue-light light-emitting layer, which includes, for example, the following steps S531 to S533.

Step S531, determining a sixth heat treatment temperature according to a property (for example, thermal stability) of a blue-light light-emitting layer material to be evaporated. For example, the sixth heat treatment temperature is from 40° C. to 150° C.

Step S532: by using the flat heat source 23 (for example, the steel plate) that is in the evaporation chamber 21 and at the side of the base substrate 26 facing away from the evaporation source 26, heating the base substrate 26 on which the electron blocking layer 14 is formed to the sixth heat treatment temperature.

Step S533: forming the blue-light light-emitting layer B having a sixth thickness (for example, the sixth thickness is from 20 nm to 60 nm) in the blue-light region of the base substrate 26 on which the electron blocking layer 14 is formed, by performing vacuum evaporation on the blue-light light-emitting layer material to be evaporated, and by performing a sixth heat treatment on the base substrate 26 provided with the electron blocking layer 14 by using the sixth heat treatment temperature in the process of performing the evaporation on the blue-light light-emitting layer material to be evaporated. For example, in the manufacturing process (i.e., in the step S533), the vacuum degree in the evaporation chamber 21 is lower than $10^{-4}$ Pa.

The manufacturing order of the above steps S51, S52 and S53 can be arbitrarily changed.

Step 6: the forming the hole blocking layer 16, which includes, for example, the following steps S61 to S63.

Step S61: determining a seventh heat treatment temperature according to a property (for example, thermal stability) of a hole blocking layer material to be evaporated. For example, the seventh heat treatment temperature is from 40° C. to 150° C.

Step S62: by using the flat heat source 23 (for example, the steel plate) that is in the evaporation chamber 21 and at the side of the base substrate 26 facing away from the evaporation source 26, heating the base substrate 26 on which the light-emitting layer 15 is formed to the seventh heat treatment temperature.

Step S63: forming the hole blocking layer 16 having a seventh thickness (for example, the seventh thickness is from 5 nm to 20 nm) on the base substrate 26 on which the light-emitting layer 15 is formed, by performing vacuum evaporation on the hole blocking layer material to be evaporated, and by performing a seventh heat treatment on the base substrate 26 provided with the light-emitting layer 15 by using the seventh heat treatment temperature in the process of performing the evaporation on the hole blocking layer material to be evaporated. For example, in the manufacturing process (i.e., in the step S63), the vacuum degree in the evaporation chamber 21 is lower than $10^{-4}$ Pa.

Step 7: the forming the electron transport layer 17, which includes, for example, the following steps S71 to S73.

Step S71: determining an eighth heat treatment temperature according to a property (for example, thermal stability) of an electron transport layer material to be evaporated. For example, the eighth heat treatment temperature is from 40° C. to 150° C.

Step S72: by using the flat heat source 23 (for example, the steel plate) that is in the evaporation chamber 21 and at the side of the base substrate 26 facing away from the evaporation source 26, heating the base substrate 26 on which the hole blocking layer 16 is formed to the eighth heat treatment temperature.

Step S73: forming the electron transport layer 17 having an eighth thickness (for example, the eighth thickness is from 40 nm to 100 nm) on the base substrate 26 on which the hole blocking layer 16 is formed, by performing vacuum evaporation on the electron transport layer material to be evaporated, and by performing an eighth heat treatment on the base substrate 26 provided with the hole blocking layer 16 by using the eighth heat treatment temperature in the process of performing the evaporation on the electron transport layer material to be evaporated. For example, in the manufacturing process (i.e., in the step S73), the vacuum degree in the evaporation chamber 21 is lower than $10^{-4}$ Pa.

Step 8: the forming the electron injection layer 18, which includes, for example, the following steps S81 to S83.

Step S81: determining a ninth heat treatment temperature according to a property (for example, thermal stability) of an electron injection layer material to be evaporated. For example, the ninth heat treatment temperature is from 40° C. to 150° C.

Step S82: by using the flat heat source 23 (for example, the steel plate) that is in the evaporation chamber 21 and at the side of the base substrate 26 facing away from the evaporation source 26, heating the base substrate 26 on which the electron transport layer 17 is formed to the ninth heat treatment temperature.

Step S83: forming the electron injection layer 18 having a ninth thickness (for example, the ninth thickness is from 5 nm to 15 nm) on the base substrate 26 on which the electron transport layer 17 is formed, by performing vacuum evaporation on the electron injection layer material to be evaporated, and by performing a ninth heat treatment on the base substrate 26 provided with the electron transport layer 17 by using the ninth heat treatment temperature in the process of performing the evaporation on the electron injection layer material to be evaporated. For example, in the manufacturing process (i.e., in the step S83), the vacuum degree in the evaporation chamber 21 is lower than $10^{-4}$ Pa.

Step 9: The forming the second electrode layer 19, for example, which includes; forming the second electrode layer having a tenth thickness (for example, the tenth thickness is from 10 nm to 20 nm) on the electron injection layer 18 by performing vacuum evaporation on a second electrode layer (e.g., the cathode layer) material to be evaporated. For example, the vacuum degree in the evaporation chamber 21 during this manufacturing process is lower than $10^{-4}$ Pa.

In the above steps, the thicknesses of the hole injection layer 12, the hole transport layer 13, the electron blocking layer 14, the light-emitting layer 15, the hole blocking layer 16, the electron transport layer 17 and the electron injection layer 18 are generally based on actual organic electroluminescent devices and the above steps are merely illustrative.

Based on the same inventive concept, the embodiments of the present disclosure further provide an organic electroluminescent device which is manufactured by the manufacturing method provided by any one of the embodiments of the present disclosure.

For example, the first electrode layer 11 is the anode layer and the second electrode layer 12 is the cathode layer; or, the first electrode layer 11 is the cathode layer and the second electrode layer 12 is the anode layer.

The organic electroluminescent device provided by the embodiments of the present disclosure is manufactured by the above manufacturing method; in performing the evaporation on the organic functional layer material to be evaporated in the above manufacturing method, the heat treatment is performed on the base substrate on which the first electrode layer (for example, the anode layer) is formed so as to improve the morphology of the organic functional layer, thereby to affect the performance of the organic functional layer, and further to improve the service life of the organic electroluminescent device.

In an embodiment as shown in FIG. 2, the organic electroluminescent device includes the first electrode layer 11, the hole injection layer 12, the hole transport layer 13, the electron blocking layer 14, the light-emitting layer 15, the hole blocking layer 16, the electron transport layer 17, the electron injection layer 18 and the second electrode layer 19 which are sequentially stacked.

Based on the same inventive concept, referring to FIG. 3, the embodiments of the present disclosure further provide an evaporation apparatus including the evaporation chamber 21 and the evaporation source 22 disposed in the evaporation chamber 21, the evaporation apparatus further includes the heat source 23 in the evaporation chamber 21, and the heat source 23 is configured for performing the heat treatment on the base substrate 26, on which the first electrode layer is formed, in the process of performing the evaporation on the organic functional layer material 25 to be evaporated in using the manufacturing method according to any one of the embodiments to manufacture the organic electroluminescent device 24 (shown in the dashed box in FIG. 3) provided by any one of the embodiments.

For example, the first electrode layer 11 is the anode layer and the second electrode layer 12 is the cathode layer; or, the first electrode layer 11 is the cathode layer and the second electrode layer 12 is the anode layer.

In a situation where the organic electroluminescent device is manufactured by using the evaporation apparatus, the heat treatment is performed on the base substrate on which the first electrode layer (for example, the anode layer) is formed during the evaporation of the organic functional layer material to be evaporated, so as to improve the morphology of the organic functional layer, thereby to affect the performance of the organic functional layer, and further to increase the service life of the organic electroluminescent device.

In an embodiment, as shown in FIG. 3, the organic electroluminescent device 24 further includes a circuit (e.g., a switch element array circuit) 27 between the base substrate 26 and the first electrode layer (e.g., the anode layer) 11, and includes a pixel defining layer 28 for forming a plurality of pixel regions (for example, the red-light region R, the green-light region G and the blue-light region B described above).

In an embodiment, as shown in FIG. 3, the heat source 23 is the heating substrate that is in the evaporation chamber 21 and at the side of the base substrate 26 facing away from the evaporation source 22 (the evaporation source 22 is configured for heating the organic functional layer material to be evaporated).

For example, the heating substrate is a flat metal plate (for example, the steel plate). As shown in FIG. 3, in the case where the heat source 23 is the heating substrate, the heating substrate is parallel to the base substrate 26, and the entire surface that is included by the heating substrate and faces the base substrate 26 is a flat surface.

In summary, in the embodiments of the present disclosure, in the process of manufacturing the organic electroluminescent device, the base substrate formed with the first electrode layer is heated during the evaporation of the organic functional layer material to be evaporated, so as to improve the morphology of the organic functional layer, thus to affect the performance of the organic functional layer and further to increase the service life of the organic electroluminescent device.

What are described above is related to the illustrative embodiments of the disclosure only and not limitative to the scope of the disclosure; the scopes of the disclosure are defined by the accompanying claims.

What is claimed is:

1. A manufacturing method of an organic electroluminescent device, comprising:
   forming a first electrode layer on a base substrate;
   forming an organic functional layer on the base substrate on which the first electrode layer is formed, by performing vacuum evaporation on an organic functional layer material to be evaporated, and by performing a heat treatment on the base substrate on which the first electrode layer is formed in a process of performing the evaporation on the organic functional layer material to be evaporated;
   forming a second electrode layer on the base substrate on which the organic functional layer is formed,
   wherein the heat treatment is performed on the base substrate by using a heat source, the heat source is in an evaporation chamber in which the base substrate formed with the first electrode layer is provided, the heat source is on a side of the base substrate, the side faces away from an evaporation source for heating the organic functional layer material to be evaporated, and the heat source is spaced apart from the base substrate by a distance, and
   determining a heat treatment temperature according to a property of the organic functional layer material to be evaporated; and in a process of rising a temperature of the base substrate to the heat treatment temperature to perform the heat treatment on the base substrate on which the first electrode layer is formed, performing the evaporation on the organic functional layer material to be evaporated.

2. The manufacturing method of the organic electroluminescent device according to claim 1, wherein the heat treatment temperature is determined according to thermal stability of the organic functional layer material to be evaporated.

3. The manufacturing method of the organic electroluminescence device according to claim 2, wherein the heat source is a heating substrate.

4. The manufacturing method of the organic electroluminescence device according to claim 2, wherein the heat treatment temperature is from 40° C. to 150° C.

5. The manufacturing method of the organic electroluminescent device according to claim 2, wherein in the process of performing the evaporation on the organic functional layer material to be evaporated, a vacuum degree in the evaporation chamber is lower than $10^{-4}$ Pa.

6. The manufacturing method of the organic electroluminescent device according to claim 2, wherein the forming the organic functional layer on the base substrate on which the first electrode layer is formed comprises:
   sequentially laminating a hole injection layer, a hole transport layer, a light-emitting layer, an electron transport layer and an electron injection layer, which are formed by vacuum evaporation, on the base substrate on which the first electrode layer is formed.

7. The manufacturing method of the organic electroluminescence device according to claim 1, wherein the heat source is a heating substrate.

8. The manufacturing method of the organic electroluminescence device according to claim 1, wherein the heat treatment temperature is from 40° C. to 150° C.

9. The manufacturing method of the organic electroluminescent device according to claim 1, wherein in the process of performing the evaporation on the organic functional layer material to be evaporated, a vacuum degree in the evaporation chamber is lower than $10^{-4}$ Pa.

10. The manufacturing method of the organic electroluminescent device according to claim 1, wherein the forming the organic functional layer on the base substrate on which the first electrode layer is formed comprises:
    sequentially laminating a hole injection layer, a hole transport layer, a light-emitting layer, an electron transport layer and an electron injection layer, which are formed by vacuum evaporation, on the base substrate on which the first electrode layer is formed.

11. The manufacturing method of the organic electroluminescent device according to claim 10, further comprising:
    forming an electron blocking layer by vacuum evaporation on the hole transport layer after forming the hole transport layer and before forming the light-emitting layer.

12. The manufacturing method of the organic electroluminescent device according to claim 10, further comprising:

forming a hole blocking layer by vacuum evaporation on the light-emitting layer after forming the light-emitting layer and before forming the electron transport layer.

13. An organic electroluminescence device, wherein the organic electroluminescence device is an organic electroluminescence device manufactured by using the manufacturing method according to claim 1.

14. The manufacturing method of the organic electroluminescent device according to claim 1, wherein the forming the organic functional layer on the base substrate on which the first electrode layer is formed comprises:

sequentially laminating a hole injection layer, a hole transport layer, a light-emitting layer, an electron transport layer and an electron injection layer, which are formed by vacuum evaporation, on the base substrate on which the first electrode layer is formed.

15. The manufacturing method of the organic electroluminescent device according to claim 1, wherein the forming the organic functional layer on the base substrate on which the first electrode layer is formed comprises:

sequentially laminating a hole injection layer, a hole transport layer, a light-emitting layer, an electron transport layer and an electron injection layer, which are formed by vacuum evaporation, on the base substrate on which the first electrode layer is formed.

\* \* \* \* \*